US007839414B2

(12) United States Patent
Cybart et al.

(10) Patent No.: US 7,839,414 B2
(45) Date of Patent: Nov. 23, 2010

(54) METHODS AND DEVICES FOR DISPLAY COLOR COMPENSATION

(75) Inventors: Adam Cybart, Mc Henry, IL (US); Roger W. Ady, Chicago, IL (US); John A. Burroughs, Lake Zurich, IL (US); R. Dodge D. Daverman, Chicago, IL (US); Ken K. Foo, Gurnee, IL (US); Sen Yang, Palatine, IL (US); Zhiming (Jim) Zhuang, Kildeer, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 675 days.

(21) Appl. No.: 11/830,319

(22) Filed: Jul. 30, 2007

(65) Prior Publication Data

US 2009/0033676 A1 Feb. 5, 2009

(51) Int. Cl.

| | |
|---|---|
| ***G06T 15/60*** | (2006.01) |
| ***G09G 5/00*** | (2006.01) |
| ***H04N 5/202*** | (2006.01) |
| ***H04N 5/57*** | (2006.01) |
| ***H04N 1/46*** | (2006.01) |
| ***G03F 3/08*** | (2006.01) |
| ***G02B 17/00*** | (2006.01) |
| *G02B 5/12* | (2006.01) |
| *G02B 27/00* | (2006.01) |
| *G06K 9/00* | (2006.01) |
| *G06K 9/40* | (2006.01) |

(52) U.S. Cl. ....................... 345/589; 345/426; 345/581; 345/600; 348/254; 348/687; 348/617; 348/674; 358/504; 358/509; 358/516; 358/519; 382/167; 382/274; 359/528; 359/577; 359/599

(58) Field of Classification Search ................. 345/426, 345/581, 589–594, 600, 619, 644; 348/180, 348/254, 612, 602, 617, 655, 671–672, 674, 348/687, 834, 842; 358/504, 509, 516–519; 382/162, 167, 274; 715/700; 359/527–528, 359/577, 585; 349/1, 106, 97, 127, 193

See application file for complete search history.

(56) References Cited

U.S. PATENT DOCUMENTS

| | | | | |
|---|---|---|---|---|
| 6,337,672 | B1 * | 1/2002 | Inoguchi et al. | 345/1.1 |
| 7,746,424 | B2 * | 6/2010 | Kameyama et al. | 349/96 |
| 2005/0029943 | A1 * | 2/2005 | Irie et al. | 313/582 |

(Continued)

FOREIGN PATENT DOCUMENTS

WO 2005052673 A2 6/2005

(Continued)

*Primary Examiner*—Wesner Sajous

(57) ABSTRACT

Disclosed are methods and devices for color compensation of a display having a translucent display cover applied to an outside surface of the display. A method may include characterizing a color shift due to the translucent display cover for when there is rendering of an image on the display and compensating for the color shift when rendering an image on the display. The method further may include measuring the color shift induced by the color of the finish, and as described below compensating the red, green, and blue (RGB) levels of the display so that the display image may be presented to the user as originally intended. In this way, the image quality may be substantially optimized for viewing regardless of the lens/cover surface color.

16 Claims, 7 Drawing Sheets

U.S. PATENT DOCUMENTS

2006/0125978 A1* 6/2006 Hiyama et al. ................ 349/96
2006/0262053 A1 11/2006 Lee et al.
2007/0040994 A1* 2/2007 Shiraishi et al. ............... 353/57
2007/0236438 A1* 10/2007 Sung ........................... 345/88
2009/0080058 A1* 3/2009 Kothari et al. .............. 359/290
2010/0027082 A1* 2/2010 Wiltshire ....................... 359/2

FOREIGN PATENT DOCUMENTS

WO 2006019283 A1 2/2006
WO 2007069159 A2 6/2007

* cited by examiner

METHODS AND DEVICES FOR DISPLAY COLOR COMPENSATION

FIELD

Disclosed are methods and electronic devices for color compensation of a display, and more particularly methods and electronic devices for color compensation of a display having a tinted lens or cover placed over it.

BACKGROUND

Today, mobile phones have become a necessity and, like an automobile, an extension of a user's personal style. Mobile phones are now considered as a fashion statement of individuality, personality and even a status symbol. Trend conscious people may stress more on the design than features. The color of a phone also may be measured while taking style into consideration. For example, the color black makes a fashion statement that is classically chic and sophisticated. A user can even personalize a phone with different color and pattern schemes by purchasing various phone covers. When shopping for a mobile phone, many customers first observe the look and the design of a mobile.

Another manner in which to differentiate designs of mobile device products in the marketplace is by including a homogeneous color and finish over the complete exterior of the product including over the display viewing areas. Designs of a single color may include a permanent film or a changeable film over the device. In this way, a visually hidden or borderless caller ID (CLI) and main display can give a device a sleek appearance.

Color matching the semi-translucent finishes and material over display viewing areas may be accomplished by applying a tint and/or semi-translucent vacuum metallization (VM) finish to the protective lens/cover located above the display. The tinted VM finish or tinted lens material creates a two way mirror or shadow box effect which visually hides the display from the user. Once the display is activated (via back lighting, front lighting, or an emissive technology) the display is then revealed to the user. This type of display may also be referred to as a morphing display.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 1 depicts the mobile telephone with a film adhered thereto, hiding the display;

FIG. 1 depicts the mobile telephone with a film adhered thereto, hiding the display;

FIG. 1 depicts the mobile telephone with a film adhered thereto, hiding the display;

FIG. 1 depicts the mobile telephone with a film adhered thereto, hiding the display.

Figure 1:
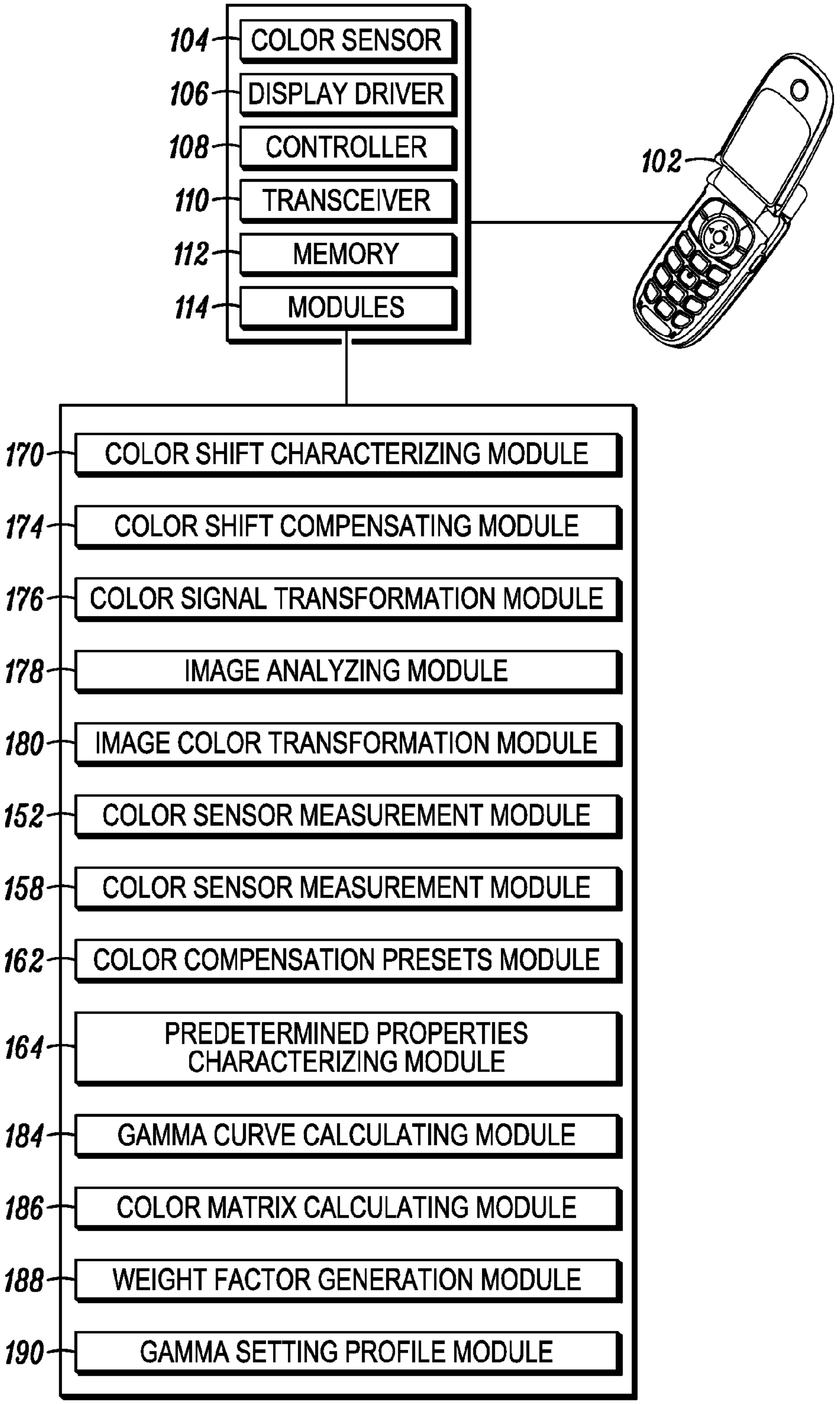
FIG. 1 illustrates an electronic device that may be a mobile communication device.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In applying a tinted vacuum metallization (VM) finish or tinted lens material, the color of the display lens/cover translucent finish can offset the intended color of the display image. For example, a red tinted VM finish or red translucent lens will result in a display image that appears to be over saturated in red, a blue finish will result in a bluish looking image, and a yellow finish will result in a yellowish looking image. Therefore, the color of the display image may not be presented to the user as originally intended.

Disclosed are methods and devices for color compensation of a display having a translucent display cover applied to an outside surface of the display. A method may include characterizing a color shift due to the translucent display cover for when there is rendering of an image on the display and compensating for the color shift when rendering an image on the display. The method further includes measuring the color shift induced by the color of the finish, and as described below compensating the red, green, and blue (RGB) levels of the display so that the display image may be presented to the user as originally intended. In this way, the image quality may be substantially optimized for viewing regardless of the lens/cover surface color.

A number of different embodiments are discussed in detail below. For example, an embodiment of an electronic device with a display having a front surface includes a color altering layer adjacent the front surface of the display, a display driver coupled to the display, and a controller coupled to the display driver. The controller may be configured to analyze signals corresponding to an image to be displayed, compensate for a color shift due to the color altering layer, generate color compensated signals and communicate the color compensated signals to the display driver. In this way, the image quality may be substantially optimized for viewing regardless of the lens/cover surface color.

The instant disclosure is provided to explain in an enabling fashion the best modes of making and using various embodiments in accordance with the present invention. The disclosure is further offered to enhance an understanding and appreciation for the invention principles and advantages thereof, rather than to limit in any manner the invention. While the preferred embodiments of the invention are illustrated and described here, it is clear that the invention is not so limited. Numerous modifications, changes, variations, substitutions, and equivalents will occur to those skilled in the art having the benefit of this disclosure without departing from the spirit and scope of the present invention as defined by the following claims. It is understood that the use of relational terms, if any, such as first and second, up and down, and the like are used solely to distinguish one from another entity or action without necessarily requiring or implying any actual such relationship or order between such entities or actions.

At least some inventive functionality and inventive principles may be implemented with or in software programs or instructions and integrated circuits (ICs) such as application specific ICs. In the interest of brevity and minimization of any risk of obscuring the principles and concepts according to the present invention, discussion of such software and ICs, if any, is limited to the essentials with respect to the principles and concepts within the preferred embodiments.

FIG. 1 illustrates an electronic device 102 that may be a mobile communication device. As discussed above, a mobile communication device 102 may include a homogeneous color and/or finish over the complete exterior of the product including over the display viewing areas. As illustrated, the CLI and/or main display is visually hidden until the display is activated (via back lighting, front lighting, or an emissive technology) so that the display is then revealed to the user. It is understood that translucent display cover refers to any color changing coating including for example a transparent but tinted lens.

The mobile communication device 102 may be implemented as a cellular telephone (also called a mobile phone). The mobile communication device 102 represents a wide variety of devices that have been developed for use within various networks. Such handheld communication devices include, for example, cellular telephones, messaging devices, personal digital assistants (PDAs), notebook or laptop computers incorporating communication modems, mobile data terminals, application specific gaming devices, video gaming devices incorporating wireless modems, and the like. Any of these portable devices may be referred to as a mobile station or user equipment. Herein, wireless communication technologies may include, for example, voice communication, the capability of transferring digital data, SMS messaging, Internet access, multi-media content access and/or voice over internet protocol (VoIP).

The mobile device 102 may include a color sensor 104, a display driver 106 coupled to a controller 108, at least one transceiver 110, a memory 112 that may incorporate modules 114. For example, modules may make up some or all of a color management algorithm that may external to a device 554 (see FIG. 5 below), or internal to a device 162. The modules may include color shift characterizing module 170, an exterior color sensor measurement module 152, an interior color sensor measurement module 158, a color compensation presets module 162, a predetermined properties characterizing module 164, a color shift compensating module 174, color signal transformation module 176, an image analyzing module 178, a gamma curve calculation module 184, a color matrix calculating module 186, a weight factor generating module 188 and a gamma setting profile module 190. The modules can carry out certain processes of the methods as described herein. The modules can be implemented in software, such as in the form of one or more sets of prestored instructions, and/or hardware, which can facilitate the operation of the mobile station or electronic device as discussed below. The modules may be installed at the factory or can be installed after distribution by, for example, a downloading operation. The operations in accordance with the modules will be discussed in more detail below.

Figure 2:
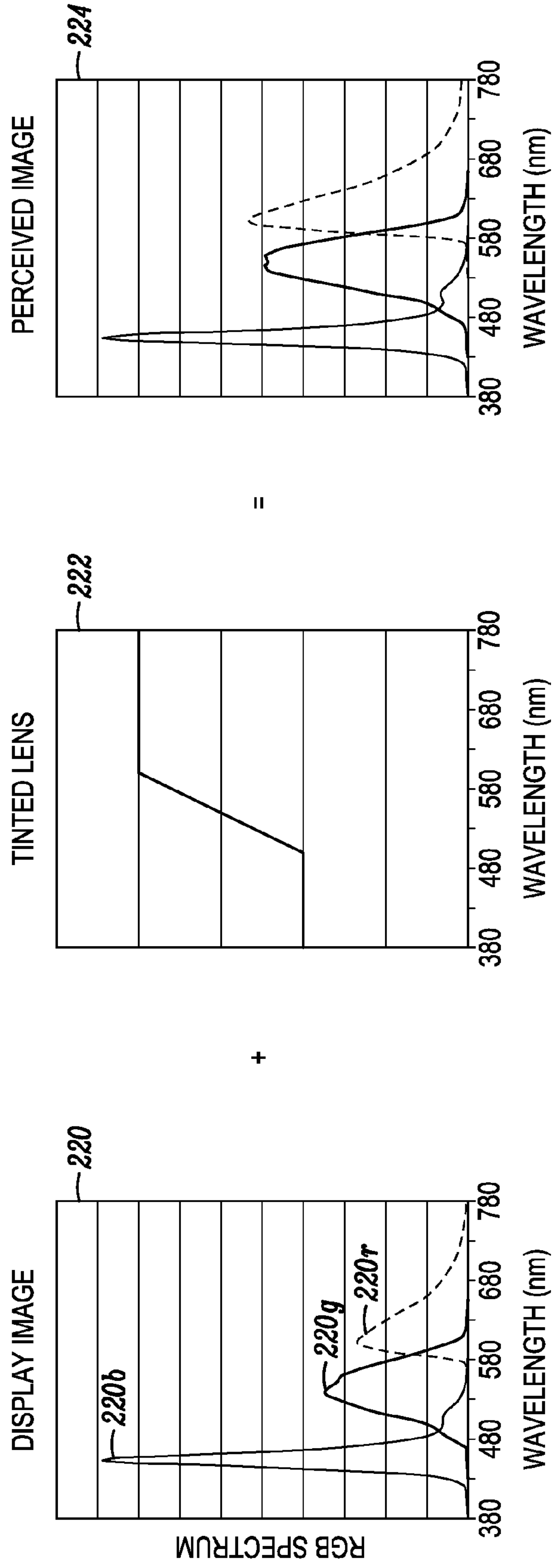
FIG. 2 is a set of graphs depicting a normal display image and the addition of a yellow tinted lens, so that the perceived image has more green and red, and less blue.

FIG. 2 is a set of graphs depicting a normal display image 220 and the addition of a yellow tinted lens 222, so that the perceived image 224 has more green and red, and less blue. In this way, when a finish is applied over the display, in this example a yellow finish, the blue tones of the display may suffer. The display's perceived quality may be compromised and so will the user's experience in viewing the display.

Figure 3:
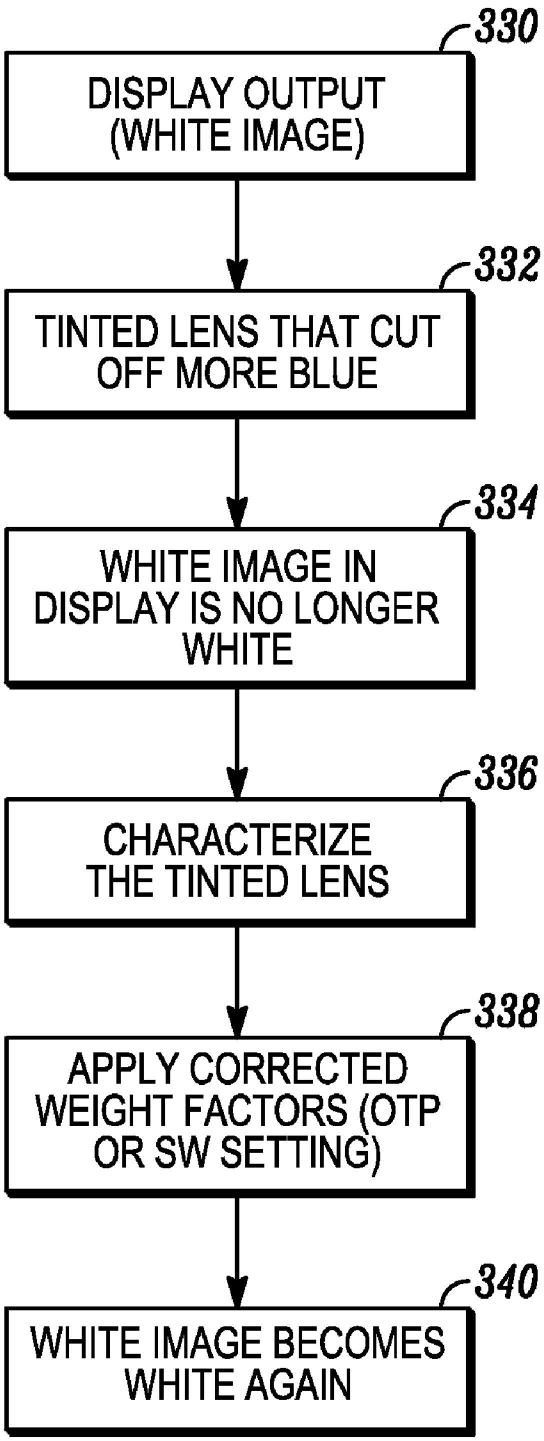
FIG. 3 is a flow chart illustrating the problem with an application of a color over a display of a device similar to that illustrated in FIG. 1.

FIG. 3 is a flow chart illustrating the problem with an application of a color over a display of a device 102 (see FIG. 1). The display output is typically a white image before a tinted lens is applied 330. A lens, for example a yellow lens as discussed with reference to FIG. 2, may be applied that cuts out blue 332. Therefore, the original white image is no longer white 334. In any number of the embodiments described below, plus others, the color of the lens is characterized 336 so that a corrected weight factor (______(OTP) or software (SW) setting) may be applied 338 so that the image of the original white image becomes white again 340.

Figure 4:
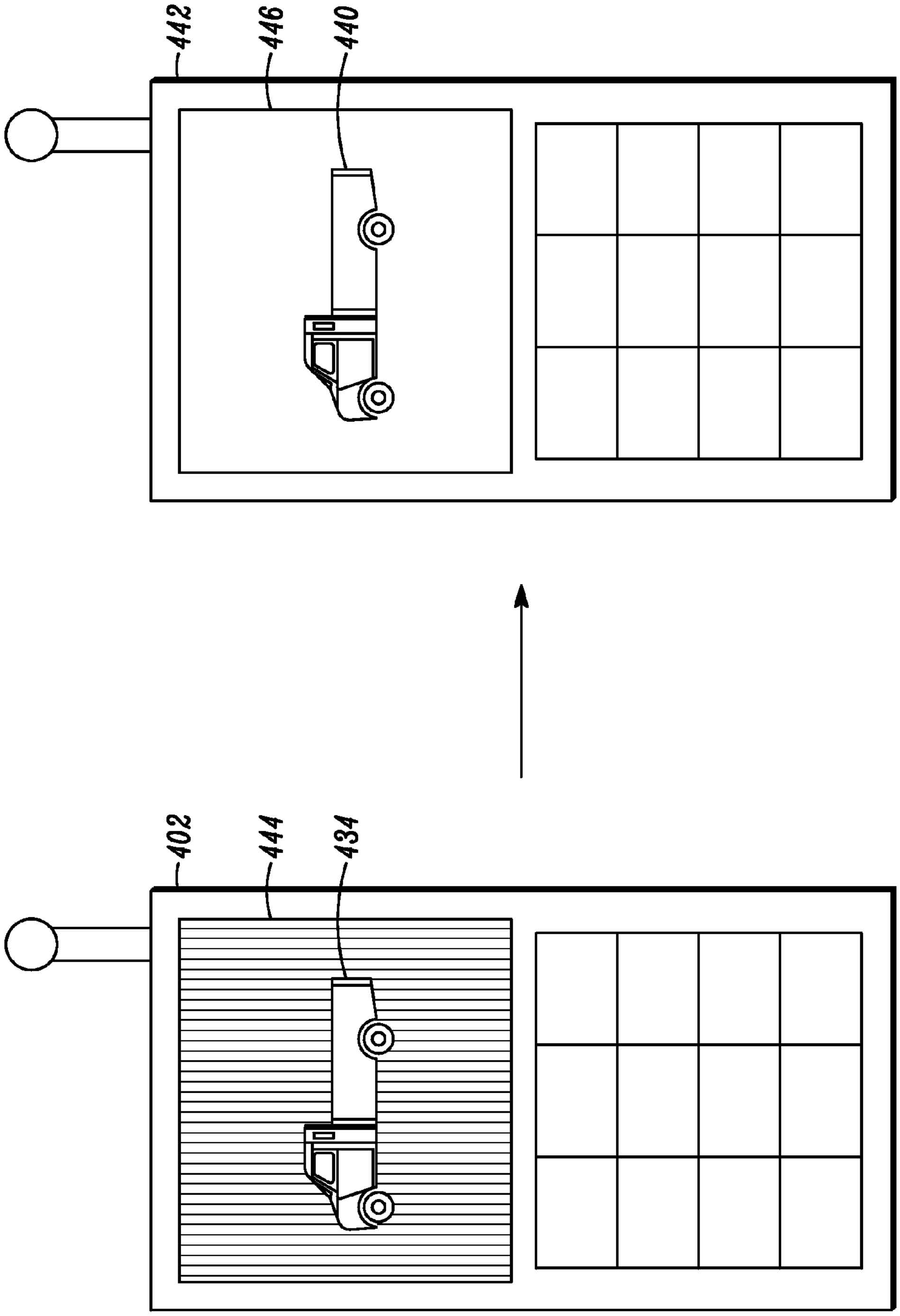
FIG. 4 depicts two devices each having a display, the first of which has a film applied thereto over an uncorrected image, and the second of which has a film applied over a corrected image.

As mentioned above, a finish or lens covering that coats one or more displays of the device 102 (see FIG. 1) may be applied under any number of circumstances. For example, during manufacture, a film may be applied. Alternatively, during distribution, a film may be applied. Also, a user may apply a film to the device. For example, were the device to be delivered with a red film, and a user wished to have an orange device, a user may apply a yellow film over the red film to make an orange device. A user may apply a film directly to the device 102, or on top of an already existing film on the device 102. Depending upon the manner is which the device 102 (see FIG. 2) is coated different embodiments for compensating the color of the display output are described below. FIG. 4 depicts two devices 402 and 442 each having a display 444 and 446, the first of which has a film applied thereto over an uncorrected image 434, and the second of which has a film applied over a corrected image 440. In the uncorrected image 434, for example, a red tinted VM finish or red translucent lens, denoted by the pattern of vertical lines covering the display 444 will result in a display image that appears to be over saturated in red, a blue finish will result in a bluish looking image, and a yellow finish will result in a yellowish looking image. The pattern on the vehicle image shown on the display 434 denotes an orange color. In the corrected image 440, the vehicle color may be seen by a viewer as yellow or gold, as denoted by the pattern on the vehicle image of 440. The described devices and methods, depending upon the circumstances, includes in some way measuring the color shift induced by the color of the finish of device 402 and its uncorrected image 434, and as described below compensating the red, green, and blue (RGB) levels of the display so that the display image may be presented to the user as originally intended such as image 440. It is understood that the color signals of the display may include other types of color signals than RGB. For example, some displays user more than three primary color signals, for example RGB white, and RGB yellow displays. It is understood that the color signals are generated with at least three principal color signals and may be different from the RGB scheme. In this way, the image quality may be substantially optimized for viewing regardless of the lens/cover surface color.

Figure 5:
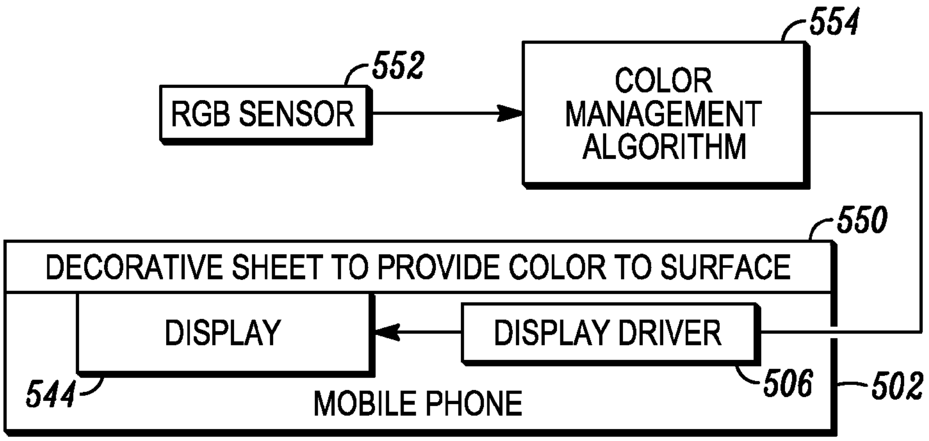
FIG. 5 is a side view of device showing a display that is otherwise not shown in FIG. 1 since

FIG. 5 is a side view of device 502 showing a display 544 that is otherwise not shown in FIG. 1 since FIG. 1 depicts the mobile telephone with a film 550 adhered thereto, hiding the display. The display 544 may be driven by display driver 506. A decorative sheet 550 to provide color to the surface is depicted over the surface. As discussed, the decorative sheet 550 may cover the entire device 502, or any portion of the device 502. In this embodiment, during the back-end testing in the factory, a color sensor 552 may be positioned adjacent the film 550 covered display 544 to receive light from the display 544. An output signal from the color sensor 552 may be directed to a color management algorithm 554 that may be running on a computer. The color management algorithm 554 may use the output signal from the color sensor 552 to correct the display driver 506 to adjust for the given color of the decorative sheet 550.

Figure 6:
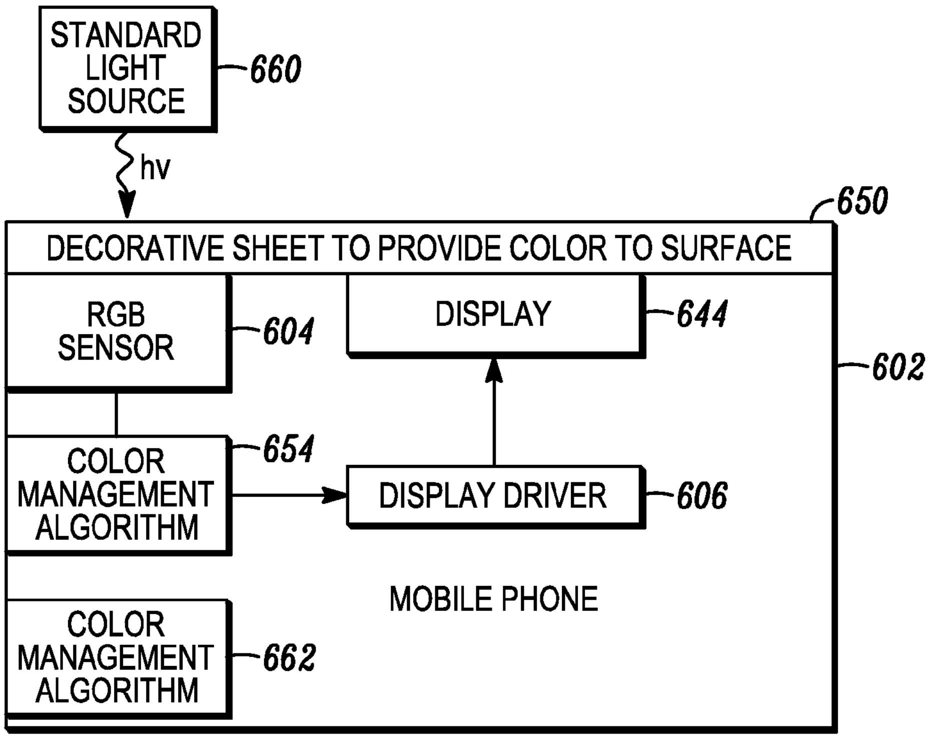
FIG. 6 is a side view of device showing a display that is otherwise not shown in FIG. 1 since

FIG. 6 is a side view of device 602 showing a display 644 that is otherwise not shown in FIG. 1 since FIG. 1 depicts the mobile telephone with a film 650 adhered thereto, hiding the display. The display 644 may be driven by display driver 606. As in FIG. 5, the decorative sheet 650 to provide color to the surface is depicted over the surface. In this embodiment, a color sensor 604, such as a RGB sensor, is incorporated into the device 602, substantially adjacent the front surface of display 644 to detect light, such as ambient light or light from a standard light source 660. An output signal from the color sensor 604 may be directed to a color management algorithm 654 that may be running on a computer. The color management algorithm 662 that may be internal to the device, may use the output signal from the color sensor 604 to correct the display driver 606 to adjust for the given color of the decorative sheet 650.

Figure 7:
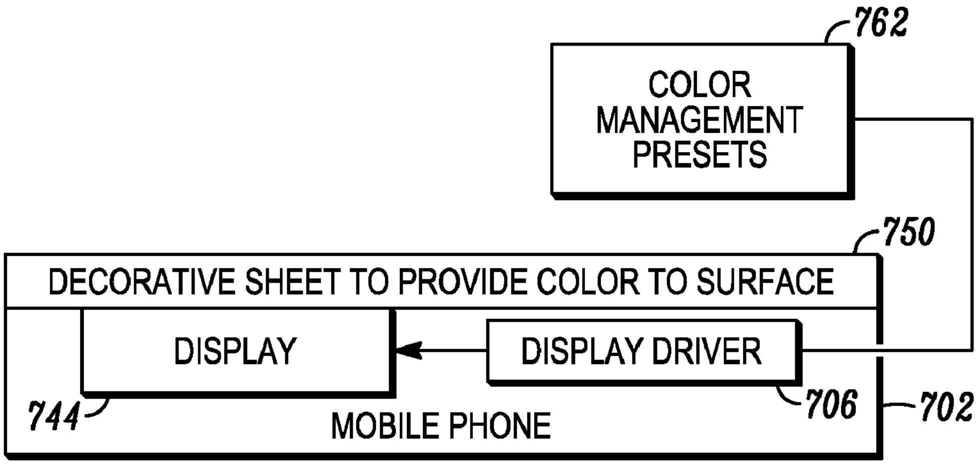
FIG. 7 is a side view of device showing a display that is otherwise not shown in FIG. 1 since

FIG. 7 is a side view of device 702 showing a display 744 that is otherwise not shown in FIG. 1 since FIG. 1 depicts the mobile telephone with a film 750 adhered thereto, hiding the display 744. FIG. 7 is another embodiment where during back-end testing in the factory, distribution, or other phase, pre-set corrections to the display driver 706 provided by color management presets 762 may be installed. The presets may be provided by the film manufacturer and/or tested for at any phase of the process.

Figure 8:
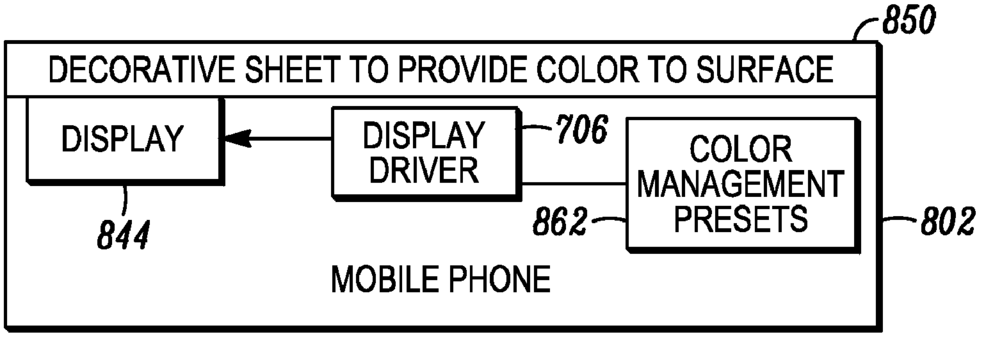
FIG. 8 is a side view of device showing a display that is otherwise not shown in FIG. 1 since

FIG. 8 is a side view of device 802 showing a display 844 that is otherwise not shown in FIG. 1 since FIG. 1 depicts the industrial look mobile telephone with a film 850 adhered thereto, hiding the display 844. FIG. 8 is another embodiment where during back-end testing in the factory, during distribution or other phase in the process, device 102 presets may be installed as color management presets 862 as a predetermined properties characterizing module 164 (see FIG. 1). Alternatively, the presets may be downloaded after the device 102, for example, after the device has been purchased. In the event that the user installs or changes the decorative sheet on the surface, the user may have the opportunity to change the preset characterization within the module 164 of the device, the module 164 being in communication the controller 108. The user may make a selection from a menu one of the downloaded presets to load into a display driver 806.

In this event, the user may optimize the image viewing for a given color of the decorative sheet he or she assembles on the device 802 by, for example, making a selection from list of decorative sheet information provided to the user via a user interface of the device 802. The user may save a color compensation preset in, for example a user profile that may be used to drive the display driver.

Referring to FIGS. 5-8, various embodiments for characterizing a color shift due to the translucent display cover for when there is rendering of an image on the display were discussed. It is understood that in accordance with a color shift characterizing module 170 (see FIG. 1), any manner for the characterization of a color shift due to the translucent display cover is within the scope of this discussion.

Figure 9:
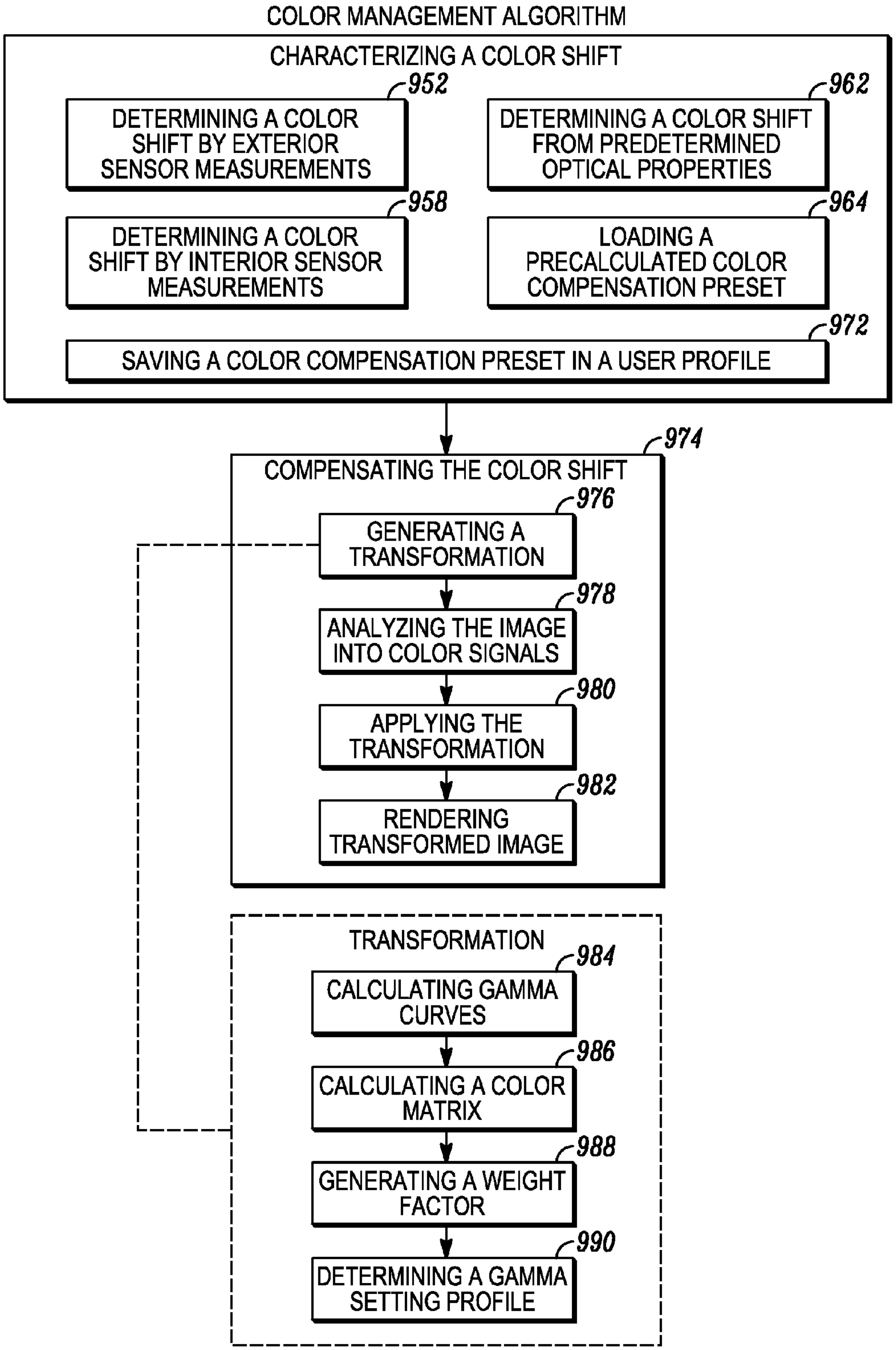
FIG. 9 is a flow chart indicating several manners for the color management algorithm to characterize a color shift in the display due to the translucent display cover applied thereto.

FIG. 9 is a flow chart indicating several manners for the color management algorithm to characterize a color shift 970 in the display due to the translucent display cover applied thereto. For example, as illustrated in FIG. 5, a method can include determining a color shift by an exterior light sensor 952 in accordance with an exterior color sensor measurement module 152 (see FIG. 1). For example, as illustrated in FIG. 6, a method can include determining a color shift by an interior light sensor 958 in accordance with an interior color sensor measurement module 158. In any event, it is understood that a method can include determining the color shift due to the translucent display cover by measurements taken with a color sensor. Moreover, in the event that sunglasses are worn by a user, a user may place the sunglasses to a color sensor and in a process, effect a change of the display to compensate for the sunglass tint.

Characterizing the color shift 970 may be further processed by predetermined optical properties 962 in accordance with a color compensation preset module 162 (see FIG. 1) for characterizing the color shift due to the translucent display cover from predetermined optical properties of the display cover material, as illustrated in FIG. 7. Characterizing the color shift 970, in yet another embodiment may be processed by a user selecting precalculated color compensation presets 964 in accordance with a predetermined properties characterizing module 164 as illustrated in FIG. 8. The characterization may be saved in a user profile or other memory module 972 of memory 112.

Once the color shift has been characterized, compensating for the color shift 974 in accordance with a color shift compensating module 174 (see FIG. 1), the method may include generating a transformation for color signals to correct for color shift 976 in accordance with the color signal transformation module 176, analyzing the image into color signals for a plurality of pixels 978 in accordance with an image analyzing module 178, applying the transformation to the color signals to generate a color transformed image 980 in accordance with a image color transformation module 180 and rendering the color transformed image on the display 982 in accordance with a rendering transformed image module 182.

The step of generating a transformation 976 as discussed above is described in more detail below and may include steps such as calculating Gamma curves from measured display output in a plurality of colors 984 in accordance with gamma curve calculating module 184 (see FIG. 1), calculating a color matrix from measured display output in the plurality of colors and from eye response curves in the plurality of colors 986 in accordance with color matrix calculating module 186, generating a weight factor from an inverse of the color matrix 988 in accordance with weight factor generation module 188, and determining, from the weight factor and from the Gamma curves, a Gamma setting profile to correct a white point of the display 990 in accordance with gamma setting profile module 190.

When a display is color balanced, the display is perceived by a user to be white when red, green, and blue pixels of the display have perceived luminances in a particular ratio, say $r_w:g_w:b_w$. A display may be driven by sending an input, denoted R, G, or B according to the pixel color, to each pixel, where the input is a byte value that can range from 0 to 255. The display may be configured so that the RGB brightness settings R=255, G=255, and B=255 result in the display's pixels being driven so that their perceived luminances are in the ratio $r_w:g_w:b_w$, that is, so that the white may be displayed. However, when a VM finish or film is applied over the display, the perceived color and brightness of each of the pixels is changed, so that the pixels' luminances may no longer be perceived in the ratio $r_w:g_w:b_w$. Correcting for this requires consideration of both how a pixel of a specific color radiates and how the eye perceives color.

Human eyes have an exponential response to luminance. The exponents of the luminance to the brightness setting are called Gamma. From the luminance curves or Gamma curves, display brightness for each color can be obtained as a function of the R, G, and B values. For example, in an embodiment the pixels may be determined to have a Gamma curves described by $$y=0.00006475x^{2.28445221}\text{ (Red)}$$

$$y=0.00009669x^{2.41969912}\text{ (Green)}$$

$$y=0.00011229x^{2.08232755}\text{ (Blue)}$$

In these expressions, y is the luminance associated with the pixel and x is the brightness setting, R, G, or B as appropriate and ranging from 0 to 255. The Gamma curves may be determined 984 according to a Gamma curve calculating module 184. In the embodiment described by the Gamma curves above, for example, white corresponds to setting x=255 in all three formulas, so that y=20.364 Cd/$m^2$ for Red, y=64.341 Cd/$m^2$ for Green, and y=11.522 Cd/$m^2$.

Each color pixel radiates according to a spectrum for that color. It is understood that a pixel may radiate by generating light itself, or may, for example, selectively transmit light produced by another element of the display, for example, a backlight. For example, the red, green, and blue pixels may radiate light according to spectra given by Red(λ), Green(λ), and Blue(λ), where λ is wavelength and Red(λ), Green(λ), and Blue(λ) are functions normalized so that $$\int d\lambda\ \text{Red}(\lambda)=r$$

$$\int d\lambda\ \text{Green}(\lambda)=g$$

$$\int d\lambda\ \text{Blue}(\lambda)=b$$

where the integrations are taken over the standard range of sensitivity of the human eye, 380 nm to 780 nm. The respective luminances are given by r, g, and b. In the example above, r=20.364 Cd/$m^2$, g=64.341 Cd/$m^2$, and b=11.522 Cd/$m^2$.

The human eye has three types of color receptors or cones, those sensitive predominantly to red, those sensitive predominantly to green, and those sensitive predominantly to blue. Their sensitivities as functions of wavelength are depicted in the graph 220 (see FIG. 2), with the curve 220$r$ representing the sensitivity $\bar{x}(\lambda)$ for red cones, the curve 220$g$ representing the sensitivity $\bar{y}(\lambda)$ for green cones, and curve 220$b$ representing the sensitivity $\bar{z}(\lambda)$ for blue cones. A pixel of a particular may excite the cones in the eye according to, for example, $$b_r=\int d\lambda\ \text{Blue}(\lambda)\bar{x}(\lambda)$$

This expression represents the excitation of a red cone due to the luminance of a blue pixel. The integration over wavelength accounts for both the radiation spectrum of the pixel and the spectral sensitivity of the red cone. By repeating this calculation for each type of cone and each color pixel, a color matrix $$\begin{pmatrix} b_r & g_r & r_r \\ b_g & g_g & r_g \\ b_b & g_b & r_b \end{pmatrix}$$

can be determined for a color balanced display without a VM finish, film, or lens/cover in place. From this color matrix the perceived luminance ratios may be determined. When a color balanced display is driven so as to appear white, the excitation of red cones is given by the sum $b_r+g_r+r_r$. The excitation of cones sensitive to green light is given by the expression $b_g+g_g+r_g$, and the excitation of cones sensitive to blue light is given by the sum $b_b+g_b+r_g$. The excitation of the respective cones, for a color balanced display, is thus given by the matrix product $$\begin{pmatrix} X \\ Y \\ Z \end{pmatrix} = \begin{pmatrix} b_r & g_r & r_r \\ b_g & g_g & r_r \\ b_b & g_b & r_b \end{pmatrix} \begin{pmatrix} 1 \\ 1 \\ 1 \end{pmatrix}$$

The excitations X, Y, and Z, are the perceived luminances discussed above, which in order that the display be perceived as white, have to have the particular ratio as previously discussed. The required particular ratio may be stored in the device memory 112 as a parameter of the color balanced display.

When a VM finish, film or lens/cover is placed over the display, the display may be corrected to compensate. A color matrix incorporating the effects of the VM finish or film may be calculated 986 according to a color matrix calculating module 186. In this calculating, the spectra Red(λ), Green(λ), and Blue(λ) include the effects of the finish or film. In this way a new color matrix $$\begin{pmatrix} b_r & g_r & r_r \\ b_g & g_g & r_g \\ b_b & g_b & r_b \end{pmatrix} \tag{1}$$

that includes the effects of the finish is obtained. Inversion of the color matrix (1) and applying the result to the excitation values X, Y, and Z provides pixel luminance values $$\begin{pmatrix} C_b \\ C_g \\ C_r \end{pmatrix} = \begin{pmatrix} b_r & g_r & r_r \\ b_g & g_g & r_g \\ b_b & g_b & r_b \end{pmatrix}^{-1} \begin{pmatrix} X \\ Y \\ Z \end{pmatrix}$$

that would be needed to render white. However, the values $C_b$, $C_g$, and $C_r$ may correspond to byte values for R, G, and B in excess of 255. Accordingly, a weight factor α is generated 988 in accordance with weight factor generation module 188, so that when the pixel luminance values are all weighted by the weight factor α, the largest byte value corresponding to $C_b$, $C_g$, and $C_r$ has a value of 255. That is to say, the weight factor α is calculated so that inverting each Gamma curve corresponding to each of the colors yields byte values for R, G, and B so that the largest byte value is 255. The weight factor α may be calculated by any known method, for example, by bracketing the solution and/or by successive approximations. The resulting byte values determine the corrected Gamma setting profile 990 that may be sent to the display driver 106 (see FIG. 1) according to a Gamma setting profile module 190. The Gamma setting profile provides the transformation to be applied to color signals of an image in order to compensate for color shift.

The disclosed methods and devices for color compensation of a display having a translucent display cover applied to an outside surface of the display may substantially optimize image quality for viewing regardless of the lens/cover surface color. The method may include characterizing a color shift due to the translucent display cover for when there is rendering of an image on the display and compensating for the color shift when rendering an image on the display. The method may further include in some way measuring the color shift induced by the color of the finish, and as described above compensating the red, green, and blue (RGB) levels of the display so that the display image may be presented to the user as originally intended. In this way, a visually hidden or borderless caller ID (CLI) and main display can give a device a sleek appearance while not compromising the user experience in viewing one or more displays of the device.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) was chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally and equitably entitled.

The invention claimed is:

1. A method for color compensation of a display having a translucent display cover applied to an outside surface of the display, the method comprising:

characterizing a color shift due to a translucent display cover for when there is rendering of an image on a display, by determining the color shift due to the translucent display cover from predetermined optical properties of a display cover material, the translucent display cover comprises a display cover material; and compensating for the color shift when rendering an image on the display.

2. The method of claim 1, wherein compensating for the color shift when rendering an image on the display comprises:

generating a transformation for color signals to correct for color shift;

analyzing the image into color signals for a plurality of pixels;

applying the transformation to the color signals to generate a color transformed image; and rendering the color transformed image on the display.

3. The method of claim 2, wherein the color signals are generated with at least three primary color signals.

4. The method of claim 2, wherein the transformation comprises:

calculating Gamma curves from measured display output in a plurality of colors;

calculating a color matrix from measured display output in the plurality of colors and from eye response curves in the plurality of colors;

generating a weight factor from an inverse of the color matrix; and determining, from the weight factor and from the Gamma curves, a Gamma setting profile to correct a white point of the display.

5. The method of claim 2, wherein the transformation is adjustable via a user interface.

6. The method of claim 1, wherein characterizing the color shift due to the translucent display cover comprises:

determining the color shift due to the translucent display cover by measurements taken with a color sensor.

7. The method of claim 1, wherein characterizing the color shift due to the translucent display cover comprises:

loading a precalculated color compensation preset into a display driver.

8. The method of claim 1, wherein characterizing the color shift due to the translucent display cover comprises:

saving a color compensation preset in a user profile.

9. A method of an electronic device having a display, the method comprising:

characterizing a color shift due to a translucent display cover for when there is rendering of an image on a display, the translucent display cover comprises a display cover material over the display; and generating a transformation for color signals to correct for color shift;

analyzing the image into color signals for a plurality of pixels;

applying the transformation to the color signals to generate a color transformed image; and rendering the color transformed image on the display.

10. The method of claim 9, wherein characterizing the color shift due to the translucent display cover comprises:

downloading a plurality of predetermined color compensation presets into the device; and selecting from a menu one of the downloaded presets to load into a display driver.

11. The method of claim 9, wherein characterizing the color shift due to the translucent display cover comprises:

sensing color by a color sensor of the device;

determining the color shift due to the translucent display cover by measurements taken with the color sensor.

12. The method of claim 9, the display having a front surface, wherein characterizing a color shift due to the translucent display cover comprises:

characterizing a color shift due to a color altering layer adjacent the front surface of the display.

13. The method of claim 12, further comprising:

downloading a profile including a predetermined color compensation preset; and compensating a color shift due to the color altering layer, according to the downloadable profile.

14. An electronic device, comprising:

a display having a front surface;

a color altering layer adjacent the front surface of the display;

a display driver coupled to the display; and a controller coupled to the display driver and configured to:

analyze signals corresponding to an image to be displayed;

compensate for a color shift due to the color altering layer;

generate color compensated signals; and communicate the color compensated signals to the display driver, wherein a color compensation preset is settable in a profile.

15. The electronic device of claim 14, wherein the color altering layer is user postponeable.

16. The electronic device of claim 14, further comprising:

a color sensor coupled to the controller and configured to measure a color shift due to the color altering layer.

* * * * *